United States Patent
Suh et al.

[11] Patent Number: 6,004,907
[45] Date of Patent: Dec. 21, 1999

[54] METHOD OF FABRICATING A SUPERCONDUCTING JUNCTION USING CUBIC $YBA_2CU_3O_x$ THIN FILM AS A BARRIER LAYER

[75] Inventors: Jeong Dae Suh; Gun Yong Sung, both of Daejeon, Rep. of Korea

[73] Assignee: Electronics and Telecommunications Research Institute, Daejeon, Rep. of Korea

[21] Appl. No.: 09/119,394

[22] Filed: Jul. 21, 1998

[30] Foreign Application Priority Data

Nov. 20, 1997 [KR] Rep. of Korea ................ 97-61588

[51] Int. Cl.[6] ...................................... H01L 39/24
[52] U.S. Cl. ................ 505/329; 505/474; 505/190; 505/702
[58] Field of Search ................ 505/329, 474, 505/190, 702; 427/62

[56] References Cited

U.S. PATENT DOCUMENTS

| | | |
|---|---|---|
| 5,292,718 | 3/1994 | Tanaka et al. . |
| 5,627,139 | 5/1997 | Chin et al. . |
| 5,721,196 | 2/1998 | Nakamura et al. ............... 505/237 |
| 5,750,474 | 5/1998 | Sung et al. ....................... 505/329 |
| 5,892,243 | 4/1999 | Chan .................................. 257/31 |

OTHER PUBLICATIONS

B.D. Hunt et al., "All high $T_c$ edge–geometry weak links utilizing Y–Ba–Cu–O barrier layers", Appl. Phys. Lett. 59(8), Aug. 19, 1991, pp. 982–984.

D. Reagor et al., "Development of high temperature superconducting Josephson junctions and quantum interference devices using low deposition temperature $Yba_2Cu_3O_{7-x}$ barriers", Appl. Phys. Lett 66(17), Apr. 24, 1995, pp. 2280–2282.

*Primary Examiner*—Roy V. King
*Attorney, Agent, or Firm*—Jacobson, Price, Holman & Stern, PLLC

[57] ABSTRACT

The present invention forms a superconducting junction using a cubic $YBa_2Cu_3Ox$ thin film as a barrier layer. The present invention forms a first YBCO superconducting thin film, a $SrTiO_3$ insulating layer thin film on the substrate, etches a side of them in the form of inclination, subsequently integrates a non-superconducting cubic YBCO barrier thin film, a second YBCO superconducting thin film, a $SrTiO_3$ protecting layer thin film in series on the whole surface of the substrate, etches an opposite side of the etched part of the $SrTiO_3$ insulating layer thin film in the form of inclination, fabricates a superconducting junction by forming a metal electrode to said aperture after forming apertures which expose said first YBCO superconducting thin film, the second YBCO superconducting thin film, fabricates a superconducting junction upon forming the metallic electrode to the apertures, and deposits a cubic $YBa_2Cu_3Ox$ barrier thin film at a temperature of 600–650° C. and a depositing velocity of 6.5–12.2 nm/s.

11 Claims, 6 Drawing Sheets

METHOD OF FABRICATING A SUPERCONDUCTING JUNCTION USING CUBIC $YBA_2CU_3O_x$ THIN FILM AS A BARRIER LAYER

BACKGROUND OF THE INVENTION

1. Field of the Invention

The present invention relates to a method of fabricating a superconducting junction using an oxide superconducting thin film, and more particularly, to a method of fabricating a superconducting junction by integrating a first oxide superconducting thin film, a non-superconducting barrier thin film, and a second oxide superconducting thin film in series on an oxide single crystal substrate.

2. Description of the Prior Art

Generally, there must be fabricated a superconducting junction in order to apply an oxide superconducting thin film for an electronic device. There show various kinds of superconducting junction structure so far, the simplest one is a tunnel type Josephson junction.

The tunnel type Josephson junction is composed of a three layer thin film structure according as a non-superconducting barrier layer is inserted in the form of sandwich between a pair of superconducting thin films which performs a superconducting electrode function. Typically, such a tunnel type Josephson junction is fabricated by the process of depositing a first superconducting thin film, a non-superconducting barrier thin film, and a second superconducting thin film successively on the substrate.

Conventionally, there are performed a process of depositing a first YBCO superconducting thin film and a second YBCO superconducting thin film, a process of fabricating a non-superconducting barrier thin film using a YBCO superconducting thin film and a metal or oxide thin film whose the composition is different from the YBCO thin film in order to fabricate a tunnel type Josephson junction.

It is difficult to fabricate a good quality tunnel type Josephson junction because the tunnel type Josephson junction fabricated as above generates a stress by means of the difference of a lattice constant and a thermal expansion coefficient between a superconducting thin film and a non-superconducting barrier thin film. Accordingly, there is necessary a process using a barrier thin film having the composition equal to both a first superconducting thin film and a second superconducting thin film in order to improve the performance of the tunnel type Josephson junction.

SUMMARY OF THE INVENTION

It is an object of the present invention to provide a process of fabricating a tunnel type superconducting junction composed of a first YBCO superconducting thin film, a $SrTiO_3$ insulating layer thin film, a non-superconducting cubic YBCO barrier thin film, a second YBCO superconducting thin film, and a $SrTiO_3$ protecting layer thin film upon a second YBCO superconducting thin film in order to protect the degradation of superconducting properites of second YBCO thin film during ion million process.

In order to accomplish the above object, the present invention provides a method of fabricating a superconducting junction comprising steps of: forming a first YBCO superconducting thin film and insulating layer thin film on an oxide single crystal substrate; forming a first photoresist pattern on the insulating layer thin film, removing the insulating layer thin film and first superconducting thin film exposed upon etching them in the form of inclination; forming a non-superconducting cubic YBCO barrier thin film, a second YBCO superconducting thin film and protecting layer thin film on a whole surface of the substrate; forming a second photoresist pattern which exposes the opposite side of the part etched in the form of inclination on the protecting layer thin film, etching the protecting layer thin film and second YBCO superconducting thin film and non-superconducting cubic YBCO barrier thin film exposed in series in the form of inclination; and depositing the thin film in a deposition rate of 6.5–12.2 nm/s by a pulse laser deposition method, forming the non-superconducting cubic YBCO barrier thin film at a temperature of 600–650° C.

In one aspect of the present invention, the present invention provides a method of fabricating a superconducting junction comprising steps of: forming a first YBCO superconducting thin film and insulating layer thin film on an oxide single crystal substrate; forming a first photoresist pattern on the insulating layer thin film, removing the insulating layer thin film and first superconducting thin film exposed upon etching them in the form of inclination; forming a non-superconducting cubic YBCO barrier thin film, a second YBCO superconducting thin film and protecting layer thin film on a whole surface of the substrate; forming a second photoresist pattern which exposes the opposite side of the part etched in the form of inclination on the protecting layer thin film, etching the protecting layer thin film and second YBCO superconducting thin film and non-superconducting cubic YBCO barrier thin film exposed in series in the form of inclination; and depositing the thin film at a temperature of 600–650° C., forming the non-superconducting cubic YBCO barrier thin film in a deposition rate of 6.5–12.2 nm/s.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Hereinafter, the embodiment of the present invention will be explained with referring to the attached draws.

FIGS. 1a through 1j show a process sectional view of fabricating a tunnel type superconducting junction according to the present invention.

As shown in FIGS. 1a through 1j, a process of fabricating a tunnel type superconducting junction of the present invention comprises a process of depositing a first YBCO superconducting thin film, a SrTiO$_3$ insulating thin film, a non-superconducting cubic YBCO barrier thin film, a second YBCO superconducting thin film, and a SrTiO$_3$ protecting layer thin film on a substrate in series.

The first characteristic of the present invention resides in a process of depositing a non-superconducting cubic YBCO barrier thin film in a deposition rate of 12.2 nm/s at a substrate temperature in the range of 600–650° C. In the case that the substrate temperature is lower than 600° C., the YBCO barrier thin film grows in amorphous, in the case of higher than 650° C., a non-superconducting barrier thin film doesn't grow by growing in the superconducting thin film having a c-axial oriented orthorhomic crystal structure.

The second characteristic of the present invention resides in a process of depositing a non-superconducting barrier thin film in a deposition rate of the range of 6.5–12.2 nm/s at a substrate temperature of 650° C. In the case that the deposition rate is lower than 6.5 nm/s, the c-axial oriented orthorhomic YBCO superconducting barrier thin film grows, a cubic YBCO barrier thin film doesn't grow.

Embodiment 1

Hereinafter, there will be explained in detail with respect to a process of fabricating a tunnel type superconducting junction composed of a first YBCO superconducting thin film, a SrTiO$_3$ insulating layer thin film, a non-superconducting cubic YBCO barrier thin film, a second YBCO superconducting thin film, and a SrTiO$_3$ protecting layer thin film according to embodiment 1 of the present invention.

Figure 1A:
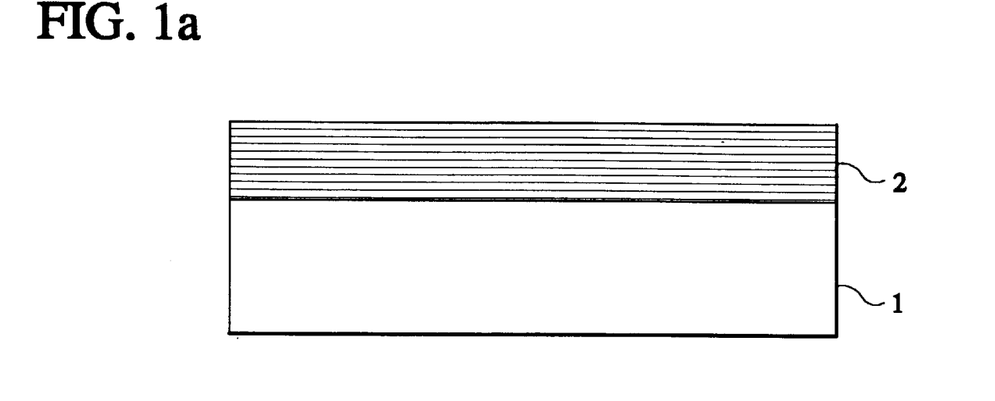
FIG. 1 is a processing view of fabricating a tunnel type Josephon junction fabricated according to the present invention.

First, referring to FIG. 1a, there is deposited a first YBCO superconducting thin film 2 in the thickness of 250 nm under the depositing condition of depositing oxygen pressure of 100 mTorr, a distance between a substrate and a target of 4.2 cm, a deposition rate of 12.2 nm/s, a pulse laser repeating ratio 100 Hz, a pulse laser energy density of 1 J/cm$^2$, and a depositing temperature of 750–800° C. on a SrTiO$_3$ 100 or a single crystal substrate 1 by the pulse laser deposition method.

Figure 1B:
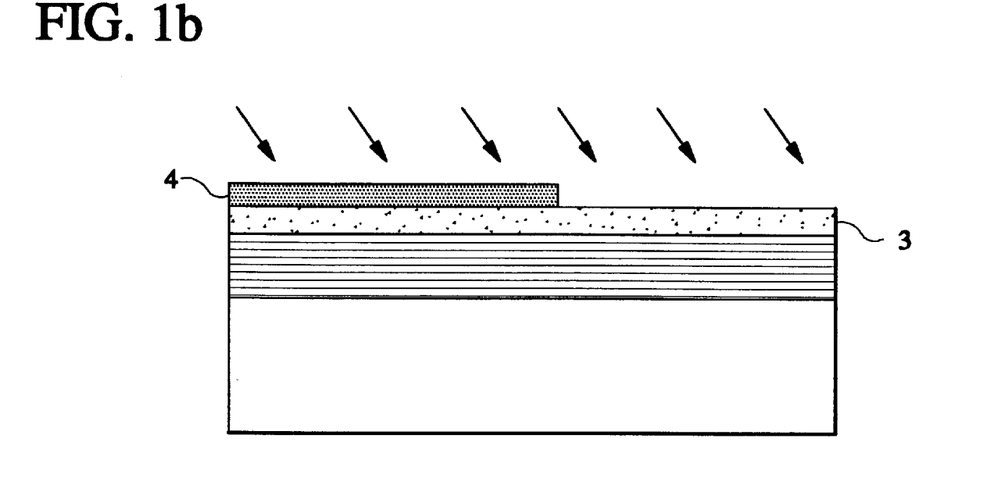

Thereafter, as shown in FIG. 1b, there is deposited a SrTiO$_3$ insulating layer thin film 3 in the thickness of 20 nm under the depositing condition of a pressure 100 mTorr of depositing oxygen, a distance between a substrate and a target of 4.2 cm, a deposition rate of 0.6 nm/s, a pulse laser repeation rate of 5 Hz, a pulse laser energy density of 1 J/cm$^2$, and a depositing temperature of 750° C. on a first YBCO superconducting thin film 1. Subsequently, after a photoresist is applied on the SrTiO$_3$ insulating layer thin film 3, there is formed a first photoresist pattern 4 which exposes a part region of the SrTiO$_3$ insulating layer thin film 3 in a prescribed width by patterning it.

Figure 1C:
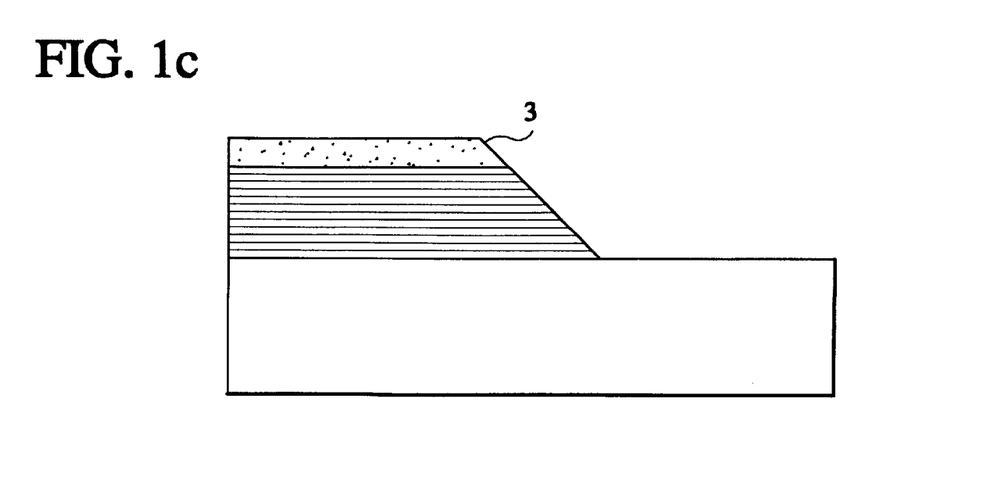

Next, as shown in FIG. 1c, there are etched the SrTiO$_3$ insulating layer thin film 3 and first YBCO superconducting thin film 2 exposed on the ion beam using the photoresist pattern 4 as an etching mask in the form of inclination, thereby removing the photoresist pattern 4.

Figure 1D:
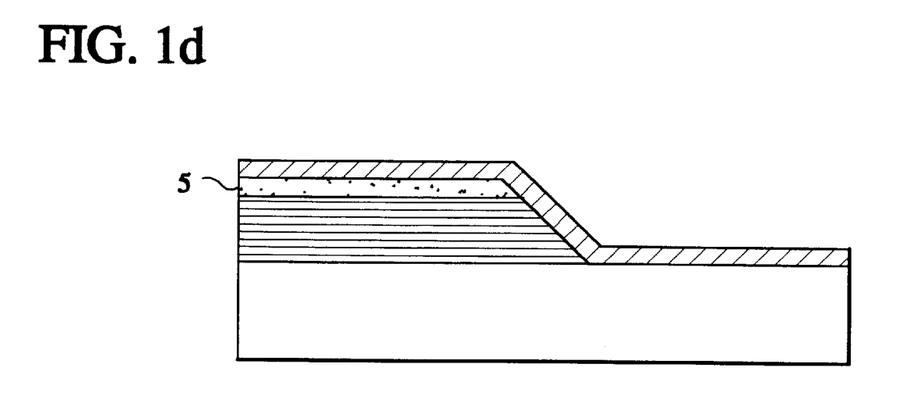

As shown in FIG. 1d, there is deposited a non-superconducting cubic YBCO thin film 5 in the thickness of 12.2–24.4 nm under the depositing condition of a pressure of 100 mTorr of depositing oxygen, a distance between a substrate and a target of 4.2 cm, a deposition rate of 12.2 nm/s, a pulse laser repeation rate 100 Hz, a pulse laser energy density of 1 J/cm$^2$, and a depositing temperature of 600–650° C. on an entire surface of the substrate.

Figure 2A:
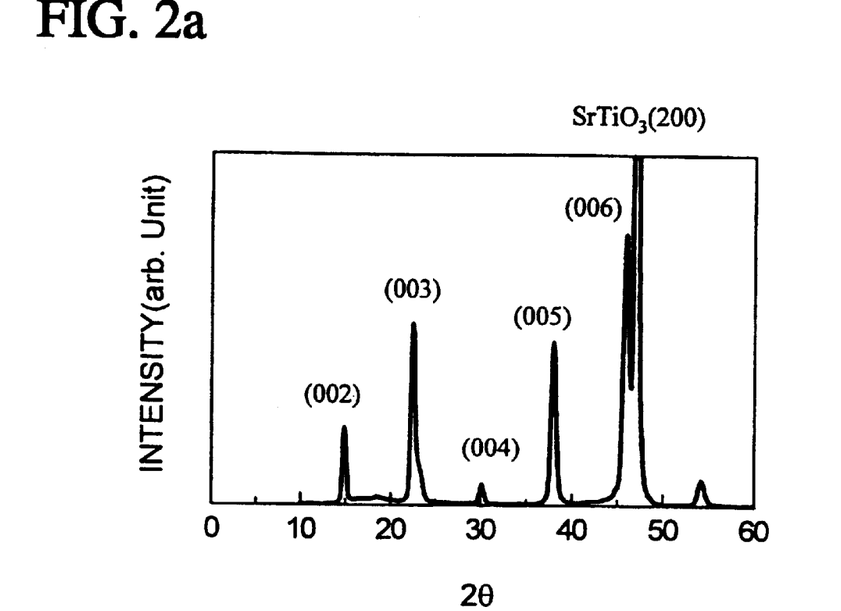
FIG. 2a is a X-ray reflection analysis view of $YBa_2Cu_3O_x$ thin film grown on $SrTiO_3$ substrate heated at a temperature of 750° C. according to the process of the present invention.

At this time, as shown in FIG. 2a, a crystal structure of a YBCO thin film 3 is analyzed in a X-ray reflection pattern upon changing the depositing temperature at a deposition rate of 12. 2 nm/s, as the result, to show only a reflection ray in a X-ray reflection pattern(00L) (L=2,3,4,5,6,7) of the YBCO thin film deposited at a temperature of 750° C.

This shows that the YBCO thin film grew in an orthorhomic crystal structure, and a c-axis of an orthorhomic crystal structure grows in the thin film oriented vertically on the substrate surface.

Figure 2B:
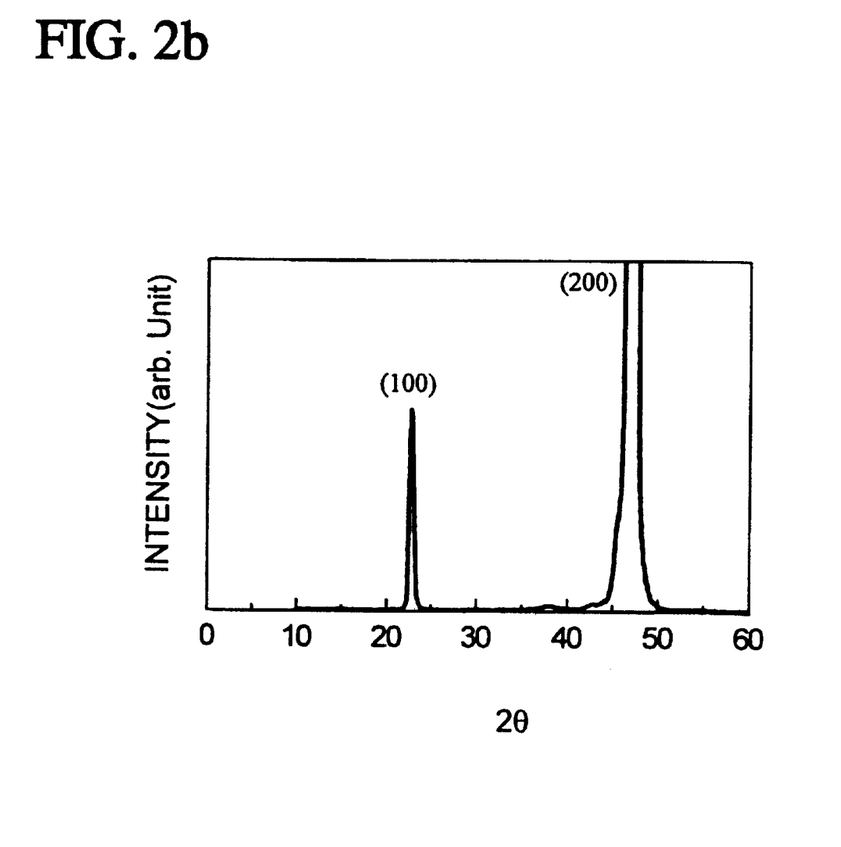
FIG. 2b is a X-ray reflection analysis view of $YBa_2Cu_3O_x$ thin film grown on $SrTiO_3$ substrate heated at 650° C. according to the process of the present invention.

However, as shown in FIG. 2b, there exists only a reflection pattern (h00) (h=1,2) of the YBCO thin film deposited at the depositing temperature of 650° C. This shows that the crystal structure of the YBCO thin film is an orthorhomic, a-axis crystal axis grew in the thin film or the cubic thin film vertically grown on the substrate.

The lattice constant value of the YBCO thin film deposited at the depositing temperature of 650° C. and the deposition rate of 12.2 nm/s is calculated in 0.389 nm, which is large compared to 0.382 nm, of the lattice constant of an a-axis oriented orthrhomic crystal.

Accordingly, the YBCO thin film grown in the depositing velocity of 12.2 nm/s grew in the cubic thin film, the cubic thin film growth was confirmed by the Raman analysis and the fine structure analysis using a high resolution transmission penetrating electron microscope.

Figure 1E:
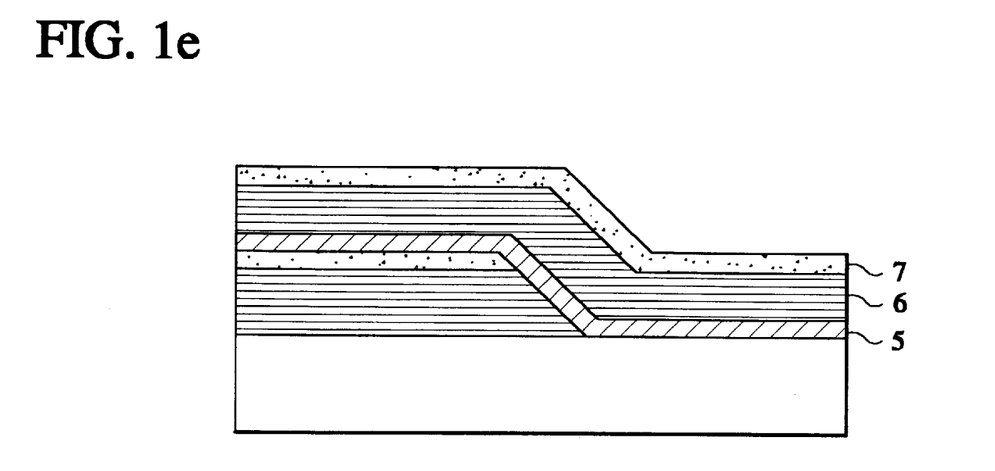

Next, as shown FIG. 1e, there is deposited a second YBCO superconducting thin film 6 in the thickness of 250 nm under the depositing condition of a pressure of 100 mTorr of depositing oxygen, a distance between a substrate and a target of 4.2 cm, a deposition rate of 12.2 nm/s, a pulse laser repeation rate 100 Hz, a pulse laser energy density of 1 J/cm$^2$, and a depositing temperature of 750° C. on a non-superconducting cubic YBCO barrier thin film 5, and there is deposited a SrTiO$_3$ protecting layer thin film 7 in the thickness of 20 nm under the depositing condition of a pressure 100 mTorr of depositing oxygen, a distance between a substrate and a target of 4.2 cm, a deposition rate of 0.6 nm/s, a pulse laser repeation rate of 5 Hz, a pulse laser energy density of 1 J/cm$^2$, a depositing temperature of 700° C. on the second YBCO superconducting thin film 6.

Figure 1F:
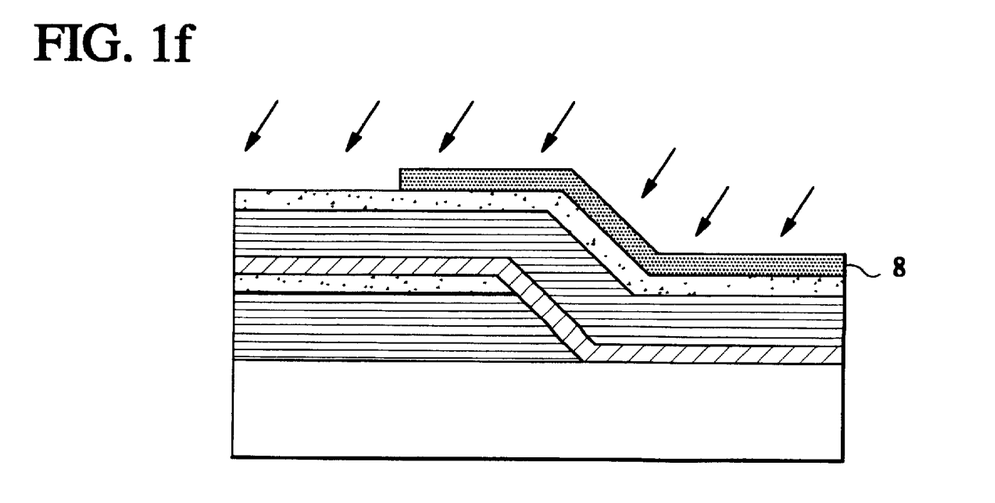

Thereafter, as shown in FIG. 1f, after a photoresist is spreaded on the SrTiO$_3$ protecting layer thin film 7, a second photoresist pattern 8 is formed patterning it so that the opposite side of the side removed of the first photoresist pattern 4 can be removed.

Figure 1G:
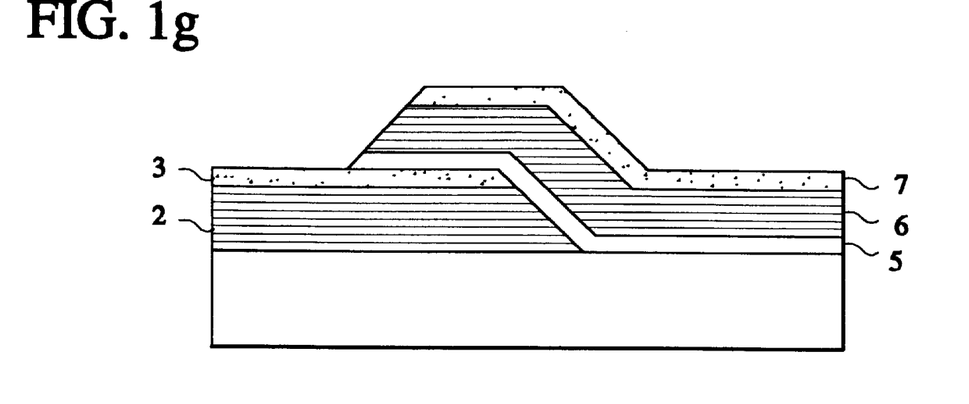

As shown in FIG. 1g, after there in series are etched the SrTiO$_3$ protecting layer thin film 7, the second YBCO superconducting thin film 6, and the non-superconducting cubic YBCO thin film 5 exposed in the form of inclination using the second photoresist pattern 8 as the etched mask on the ion beam, the second photoresist pattern 8 is removed.

Figure 1H:
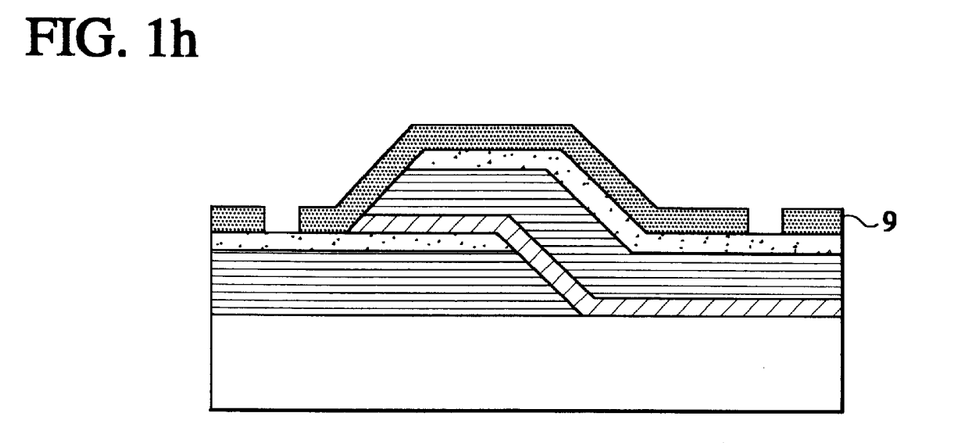

Next, as shown in FIG. 1h, after the photoresist is spreaded on the entire surface of the substrate, there is formed a third photoresist pattern 9 which exposes a prescribed portion of the SrTiO$_3$ insulating layer 3 and the SrTiO$_3$ protecting layer thin film 7 by patterning it.

Figure 1I:
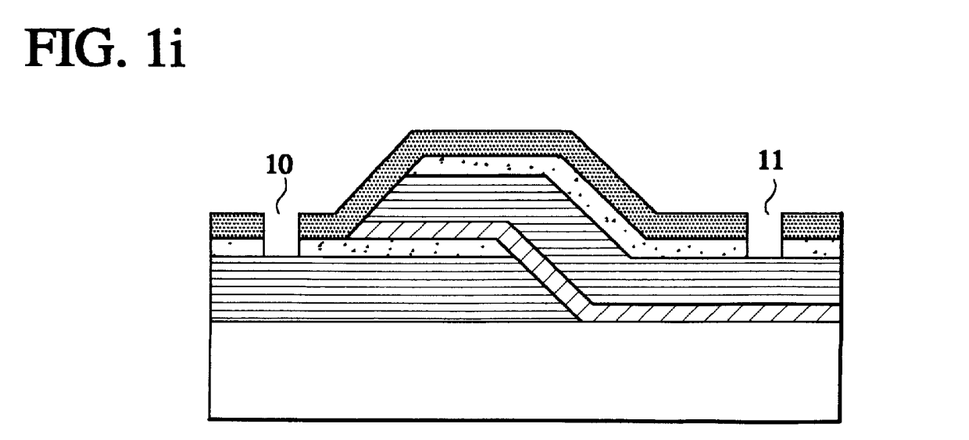

Subsequently, as shown in FIG. 1i, there are removed the SrTiO$_3$ insulating layer 3 and the SrTiO$_3$ protecting layer thin film 7 exposed using the third photoresist pattern 9 as the etching mask by use of HF solution of 1%, therefore, to form apertures 10, 11 which expose electrode forming regions of the first YBCO superconducting thin film 2 and second YBCO superconducting thin film 6.

Figure 1J:
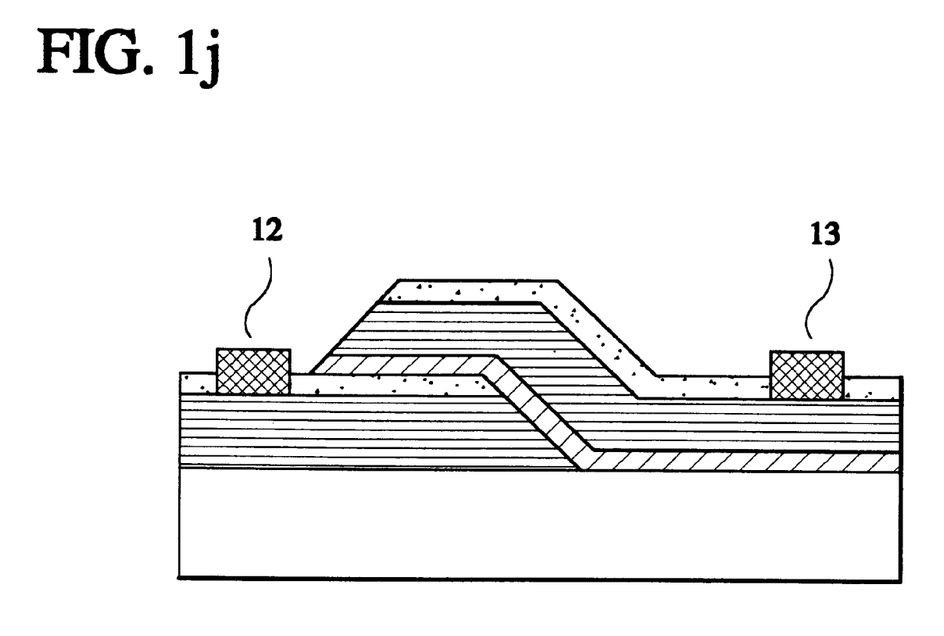

Next, as shown in FIG. 1j, there is deposited a gold thin film in the thickness of 300 nm under the depositing condition of a pressure of 100 mTorr of depositing oxygen, a distance between a substrate and a target of 4.2 cm, a deposition rate of 0.6 nm/s, a pulse laser repeation rate 5 Hz, a pulse laser energy density of 2 J/cm$^2$, and a depositing temperature of 25° C. on the third photoresist pattern 9 and in the apertures. The substrate is soaked in an acetone solution, the gold thin film formed thereon is removed with the third photoresist pattern 9 and the metallic electrodes 12, 13 are formed, therefore, to fabricate a tunnel type superconducting junction.

Embodiment 2

The characteristic of the second embodiment according to the present invention resides in a process of depositing a non-superconducting cubic YBCO barrier thin film by use of a deposition rate of higher than 6.5 nm/s at a temperature of 650° C.

The method of fabricating a tunnel type superconducting junction according to the second embodiment is proceeded according to the process sequence equal to the first embodiment, the process condition depositing each thin film is different.

Accordingly, with referring to FIGS. 1a through 1j, the second embodiment of the present invention will be explained as follows.

First, referring to FIG. 1a, there is deposited a first YBCO superconducting thin film 2 in the thickness of 250 nm under the depositing condition of 100 mTorr of depositing oxygen pressure of 100 mTorr, a distance between a substrate and a target of 4.2 cm, a deposition rate of 0.1 nm/s, a pulse laser repeation rate 1 Hz, a pulse laser energy density of 1 J/cm$^2$, and a depositing temperature of 650° C. on a SrTiO$_3$ 100 or LaSrGaO$_4$ 100 single crystal substrate 1 by the pulse laser deposition method.

Thereafter, as shown in FIG. 1b, there is deposited a SrTiO$_3$ insulating layer thin film 3 in the thickness of 20 nm under the depositing condition of a pressure 100 mTorr of depositing oxygen, a distance between a substrate and a target of 4.2 cm, a deposition rate of 0.6 nm/s, a pulse laser repeation rate of 5 Hz, a pulse laser energy density of 1 J/cm$^2$, and a depositing temperature of 700° C. on a first YBCO superconducting thin film 1. Subsequently, after a photoresist is applied on the SrTiO$_3$ insulating layer thin film 3, there is formed a first photoresist pattern 4 which exposes a part region of the SrTiO$_3$ insulating layer thin film 3 in a prescribed width by pattering it.

Next, as shown in FIG. 1c, there are etched the SrTiO$_3$ insulating layer thin film 3 and first YBCO superconducting thin film 2 exposed by use of the photoresist pattern 4 as an etched mask on the ion beam in the form of inclination, thereby removing the photoresist pattern 4.

As shown in FIG. 1d, there is deposited a non-superconducting cubic YBCO thin film 5 in the thickness of 12.2–24.4 nm under the depositing condition of a pressure of 100 mTorr of depositing oxygen, a distance between a substrate and a target of 4.2 cm, a deposition rate of 12.2 nm/s, a pulse laser repeation rate 100 Hz, a pulse laser energy density of 1 J/cm$^2$, and a depositing temperature of 650° C. on an entire surface of the substrate.

Figure 3A:
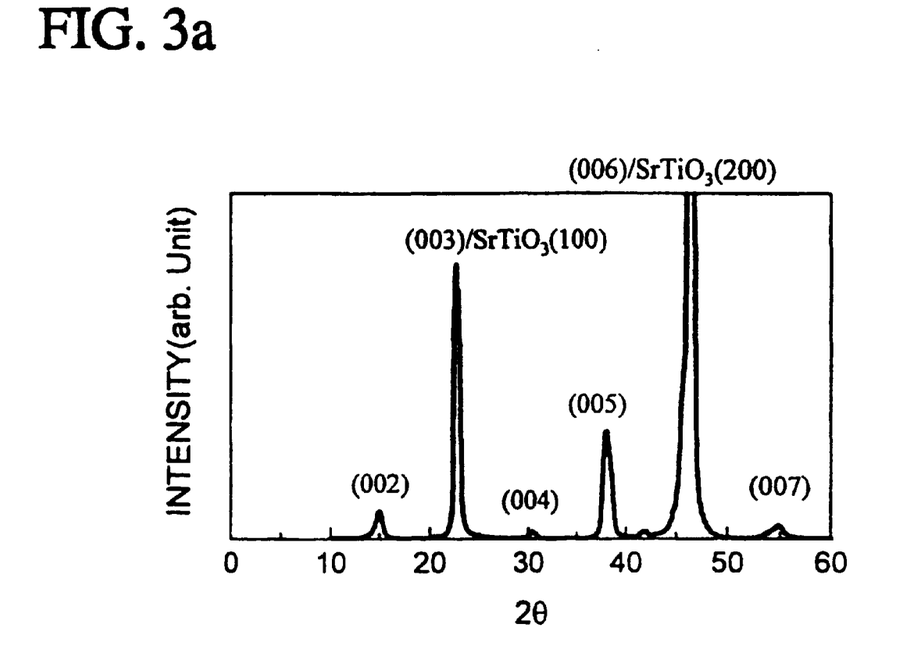
FIG. 3a is a X-ray reflection analysis view of $YBa_2Cu_3O_x$ thin film grown on $SrTiO_3$ substrate in the depositing velocity of 0.1 nm/s according to the process of the present invention.

At this time, as shown in FIG. 3a, a crystal structure of YBCO thin film 5 is analyzed in a X-ray reflection pattern upon changing the deposition rate at a depositing temperature of 650° C., as the result, as shown in FIG. 3a, to show only a reflection ray in a X-ray reflection pattern(00L) (L=2,3,4,5,6,7) of the YBCO thin film deposited at a deposition rate of 0.1 nm/s.

This shows that the YBCO thin film grew in an orthorhomic crystal structure, and a c-axis of an orthorhomic crystal structure grew in the thin film oriented vertically on the substrate surface.

Figure 3B:
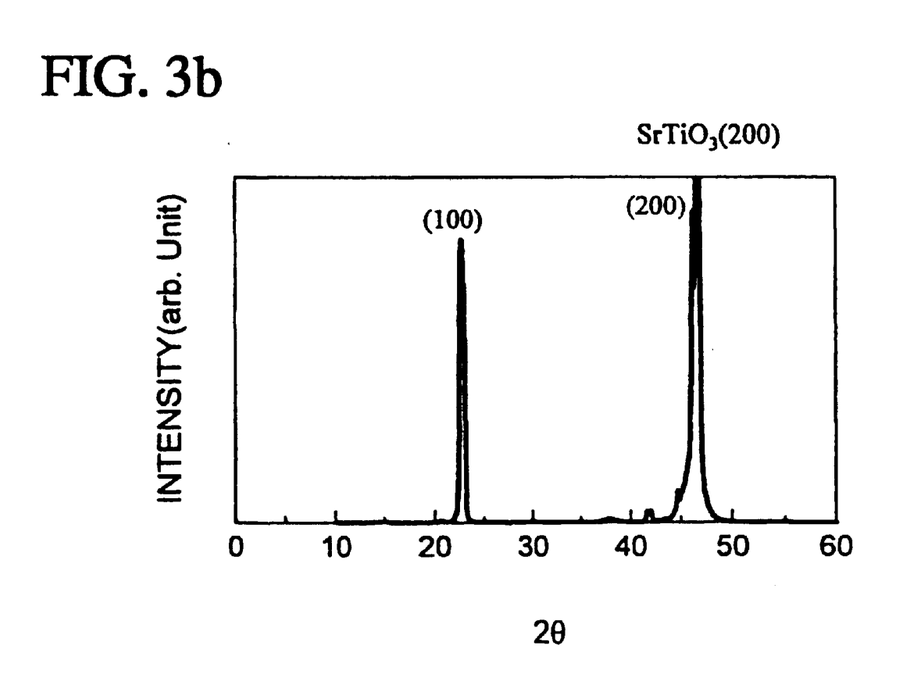
FIG. 3b is a X-ray reflection analysis view of $YBa_2Cu_3O_x$ thin film grown on $SrTiO_3$ substrate in the depositing velocity of 12.2 nm/s according to the process of the present invention.

However, as shown in FIG. 3b, there exists only the X-ray reflection pattern (h00)(h=1,2) of the YBCO thin film deposited at the depositing velocity of 12.2 nm/s. This shows that the crystal structure of the YBCO thin film is an orthrhombic, an a-axis crystal axis grew in the thin film or cubic thin film grown vertically on the substrate surface.

The lattice constant value of the YBCO thin film deposited at the deposition rate of 12.2 nm/s is calculated in 0.389 nm, which is large compared to 0.382 nm of the lattice constant of an a-axis oriented orthrhomic crystal.

Accordingly, the YBCO thin film grown in the deposition rate of 12.2 nm/s grew in the cubic thin film, the cubic thin film growth was confirmed by the Raman analysis and the fine structure analysis using a high magnifying penetrating electronic microscope.

Next, as shown FIG. 1e, there is deposited a second YBCO superconducting thin film 6 in the thickness of 250 nm under the depositing condition of a pressure of 100 mTorr of depositing oxygen, a distance between a substrate and a target of 4.2 cm, a deposition rate of 0.1 nm/s, a pulse laser repeating ratio 1 Hz, a pulse laser energy density of 1 J/cm$^2$, and a depositing temperature of 650° C. on a non-superconducting cubic YBCO barrier thin film 5, and there is deposited a SrTiO$_3$ protecting layer thin film 7 in the thickness of 20 nm under the depositing condition of a pressure 100 mTorr of depositing oxygen, a distance between a substrate and a target of 4.2 cm, a deposition rate of 0.6 nm/s, a pulse laser repeation rate of 5 Hz, a pulse laser energy density of 1 J/cm$^2$, a depositing temperature of 700° C. on the second YBCO superconducting thin film 6.

Thereafter, as shown in FIG. 1f, after a photoresist is spreaded on the SrTiO$_3$ protecting layer thin film 7, a second photoresist pattern 8 is formed patterning it so that the opposite side of the side removed of the first photoresist pattern 4 can be removed.

As shown in FIG. 1g, after there in series are etched the SrTiO$_3$ protecting layer thin film 7, the second YBCO superconducting thin film 6, and the non-superconducting cubic YBCO thin film 5 exposed in the form of inclination using the second photoresist pattern 8 as the etching mask on the ion beam, the second photoresist pattern 8 is removed.

Next, as shown in FIG. 1h, after the photoresist is spreaded on the entire surface of the substrate, there is formed a third photoresist pattern 9 which exposes a prescribed portion of the SrTiO$_3$ insulating layer 3 and the SrTiO$_3$ protecting layer thin film 7 by patterning it.

Subsequently, as shown in FIG. 1i, there are removed the SrTiO$_3$ insulating layer 3 and the SrTiO$_3$ protecting layer thin film 7 exposed using the third photoresist pattern 9 as the etching mask by use of HF solution of 1%, therefore, to form apertures 10, 11 which expose electrode forming regions of the first YBCO superconducting thin film 2 and second YBCO superconducting thin film 6.

Next, as shown in FIG. 1j, there is deposited a gold thin film in the thickness of 300 nm under the depositing condition of a pressure of 100 mTorr of depositing oxygen, a distance between a substrate and a target of 4.2 cm, a deposition rate of 0.6 nm/s, a pulse laser repeation rate of 5 Hz, a pulse laser energy density of 2 J/cm$^2$, and a depositing temperature of 25° C. on the third photoresist pattern 9 and in the apertures. The substrate is soaked in an acetone solution, the gold thin film formed thereon is removed with the third photoresist pattern 9 and the metallic electrodes 12, 13 are formed, therefore, to fabricate a tunnel type Josephson junction.

According to the fabricating method of the present invention, since there can be deposited a non-superconducting barrier material using a cubic YBCO material, it is to solve the stress problem which occurs due to the difference between the lattice constant and thermal expansion coefficient, thereby being able to fabricate a good quality tunnel type Josephon junction.

As described above, although the present invention has been described in detail with reference to illustrative embodiments, the invention is not limited thereto and various modifications and changes may be effected by one skilled in the art within the scope of the invention.

What is claimed is:

1. A method of fabricating a superconducting junction comprising the steps of:

forming a first YBCO superconducting thin film and insulating layer thin film on an oxide single crystal substrate;

forming a first photoresist pattern on said insulating layer thin film, removing the insulating layer thin film and first superconducting thin film exposed upon etching them in the form of inclination;

forming a non-superconducting cubic YBCO barrier thin film, a second YBCO superconducting thin film and protecting layer thin film on a whole surface of the substrate;

forming a second photoresist pattern which exposes the opposite side of the part etched in the form of inclination on said protecting layer thin film, etching said protecting layer thin film and second YBCO superconducting thin film and non-superconducting cubic YBCO barrier thin film exposed in series in the form of inclination; and depositing said barrier thin film at a deposition velocity of 6.5–12.2 nm/s by a pulse laser deposition method, forming said non-superconducting cubic YBCO barrier thin film at a temperature of 600–650° C.

2. The method of fabricating a superconducting junction according to claim 1, wherein said first YBCO superconducting thin film, said non-superconducting cubic YBCO barrier thin film and second YBCO superconducting thin film have a composition of $YBa_2Cu_3O_x$.

3. The method of fabricating a superconducting junction according to claim 1, wherein said insulating layer thin film and protecting layer thin film are formed of $SrTiO_3$.

4. The method of fabricating a superconducting junction according to claim 1, wherein said oxide single crystal substrate is formed of $SrTiO_3$ or $LaSrGaO_4$.

5. The method of fabricating a superconducting junction according to claim 1, wherein said first YBCO superconducting thin film and second YBCO superconducting thin film are formed at a depositing temperature of 750–800° C.

6. The method of fabricating a superconducting junction according to claim 1, wherein said insulating layer thin film and protecting layer thin film are formed at a depositing temperature of 700° C.

7. A method of fabricating a superconducting junction comprising the steps of:

forming a first YBCO superconducting thin film and insulating layer thin film on an oxide single crystal substrate;

forming a first photoresist pattern on said insulating layer thin film, removing the insulating layer thin film and first superconducting thin film exposed upon etching them in the form of inclination;

forming a non-superconducting cubic YBCO barrier thin film, a second YBCO superconducting thin film and protecting layer thin film on a whole surface of the substrate;

forming a second photoresist pattern which exposes the opposite side of the part etched in the form of inclination on said protecting layer thin film, etching said protecting layer thin film and second YBCO superconducting thin film and non-superconducting cubic YBCO barrier thin film exposed in series in the form of inclination; and depositing said barrier thin film at a temperature of 600–650° C., forming said non-superconducting cubic YBCO barrier thin film at a deposition velocity of 6.5–12.2 nm/s.

8. The method of fabricating a superconducting junction according to claim 7, wherein said first YBCO superconducting thin film, said non-superconducting cubic YBCO barrier thin film and second YBCO superconducting thin film have a composition of $YBa_2Cu_3O_x$.

9. The method of fabricating a superconducting junction according to claim 7, wherein said insulating layer thin film and protecting layer thin film are formed of $SrTiO_3$.

10. The method of fabricating a superconducting junction according to claim 7, wherein said oxide single crystal substrate is formed of $SrTiO_3$ or $LaSrGaO_4$.

11. The method of fabricating a superconducting junction according to claim 7, wherein said first YBCO superconducting thin film, said second YBCO superconducting thin film are deposited at a deposition velocity of 0.1 nm/s.

* * * * *